(12) United States Patent
Miyashita et al.

(10) Patent No.: US 10,170,674 B2
(45) Date of Patent: Jan. 1, 2019

(54) LED DEVICE

(71) Applicants: CITIZEN HOLDINGS CO., LTD., Nishitokyo-shi, Tokyo (JP); CITIZEN ELECTRONICS CO., LTD., Fujiyoshida-shi, Yamanashi (JP)

(72) Inventors: Isao Miyashita, Fujiyoshida (JP); Taku Kumasaka, Fujiyoshida (JP); Keita Watanabe, Fujiyoshida (JP); Kosuke Tsuchiya, Fujiyoshida (JP)

(73) Assignees: Citizen Watch Co., Ltd., Tokyo (JP); Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 14/901,471

(22) PCT Filed: Jun. 23, 2014

(86) PCT No.: PCT/JP2014/066540
§ 371 (c)(1),
(2) Date: Dec. 28, 2015

(87) PCT Pub. No.: WO2014/208495
PCT Pub. Date: Dec. 31, 2014

(65) Prior Publication Data
US 2016/0197253 A1    Jul. 7, 2016

(30) Foreign Application Priority Data

Jun. 28, 2013 (JP) .................................. 2013-136338
Aug. 23, 2013 (JP) .................................. 2013-173114

(51) Int. Cl.
*H01L 33/00* (2010.01)
*H01L 33/62* (2010.01)
(Continued)

(52) U.S. Cl.
CPC ............ *H01L 33/62* (2013.01); *H01L 27/156* (2013.01); *H01L 33/387* (2013.01);
(Continued)

(58) Field of Classification Search
None
See application file for complete search history.

(56) References Cited

U.S. PATENT DOCUMENTS

2007/0080360 A1* 4/2007 Mirsky ............... H01L 23/3677
257/99
2007/0097692 A1    5/2007 Suehiro
(Continued)

FOREIGN PATENT DOCUMENTS

CN    103180979 A    6/2013
CN    202996902 U    6/2013
(Continued)

OTHER PUBLICATIONS

International Search Report for International Application No. PCT/JP2014/066540 dated Jul. 29, 2014.
(Continued)

*Primary Examiner* — Evren Seven
(74) *Attorney, Agent, or Firm* — RatnerPrestia

(57) ABSTRACT

Provided is an LED device presenting minimal risk of bottom-surface contamination even when foreign substances such as liquids adhere thereto. The LED device has an LED die, a submount substrate on the surface of which the LED die is mounted, a frame-shaped electrode disposed along the outer circumferential part of the bottom surface of the submount substrate, and an inner-side electrode surrounded by the frame-shaped electrode and connected to the electrode of the LED die. In the LED device, the frame-shaped electrode is disposed along the entire outer circumferential part of the bottom surface. In an LED device, the bottom
(Continued)

surface is rectangular, and the frame-shaped electrode is disposed along three sides of the bottom surface.

4 Claims, 15 Drawing Sheets

(51) Int. Cl.
  *H01L 27/15*  (2006.01)
  *H01L 33/38*  (2010.01)
  *H01L 33/48*  (2010.01)
  *H01L 33/46*  (2010.01)

(52) U.S. Cl.
  CPC ............ *H01L 33/486* (2013.01); *H01L 33/46* (2013.01); *H01L 2224/48091* (2013.01); *H01L 2224/48227* (2013.01); *H01L 2224/48237* (2013.01)

(56) References Cited

U.S. PATENT DOCUMENTS

| | | | | |
|---|---|---|---|---|
| 2007/0194343 | A1* | 8/2007 | Jang | H01L 25/167 257/103 |
| 2008/0277677 | A1* | 11/2008 | Kuo | G09F 9/33 257/91 |
| 2008/0290353 | A1* | 11/2008 | Medendorp, Jr. | H01L 25/167 257/89 |
| 2009/0108281 | A1* | 4/2009 | Keller | H01L 33/62 257/98 |
| 2009/0315057 | A1* | 12/2009 | Konishi | H01L 24/97 257/98 |
| 2011/0309404 | A1* | 12/2011 | Lee | H01L 33/486 257/99 |
| 2012/0181569 | A1* | 7/2012 | Choi | H01L 33/62 257/99 |
| 2013/0087823 | A1* | 4/2013 | Tsai | H01L 33/38 257/98 |
| 2013/0200405 | A1 | 8/2013 | Zitzlsperger | |
| 2013/0256710 | A1* | 10/2013 | Andrews | H01L 25/0753 257/88 |
| 2013/0277701 | A1* | 10/2013 | Okabe | H01L 33/38 257/98 |
| 2013/0328074 | A1* | 12/2013 | Lowes | H01L 27/15 257/89 |
| 2014/0209962 | A1* | 7/2014 | Seo | H01L 33/08 257/99 |
| 2014/0367718 | A1* | 12/2014 | Park | H01L 33/486 257/98 |
| 2016/0056143 | A1* | 2/2016 | Park | H01L 25/167 257/91 |
| 2016/0056356 | A1* | 2/2016 | Oh | H01L 33/62 257/98 |
| 2016/0087177 | A1* | 3/2016 | Schwarz | H01L 33/0095 257/98 |
| 2016/0172564 | A1* | 6/2016 | Yamaguchi | H01L 25/0753 257/99 |
| 2016/0197253 | A1* | 7/2016 | Miyashita | H01L 33/62 257/89 |

FOREIGN PATENT DOCUMENTS

| | | |
|---|---|---|
| EP | 2477245 | 7/2012 |
| JP | 6352422 | 3/1988 |
| JP | 2005191097 | 7/2005 |
| JP | 2009130237 | 6/2009 |
| JP | 201244218 | 3/2012 |
| WO | 2012016377 A1 | 2/2012 |
| WO | 2012022782 | 2/2012 |

OTHER PUBLICATIONS

International Preliminary Report on Patentability for International Application No. PCT/JP2014/066540 dated Dec. 29, 2015.
Written Opinion of the International Searching Authority for International Application No. PCT/JP2014/066540 dated Jul. 29, 2014.
English language Supplementary European Search Report for Application No. EP 14 81 7164.8, dated Nov. 14, 2016, 7 pages.
Chinese Office Action for Chinese Application No. 201480037154.6, dated Mar. 23, 2017—13 Pages.
Chinese Office Action for Chinese Applicatin No. 201480037154.6, dated Oct. 24, 2017 with translation, 12 pages.
Chinese Office Action for Chinese Application No. 201480037154.6, dated Jul. 3, 2018, with translation, 8 pages.

* cited by examiner (a)

(b)

(c)

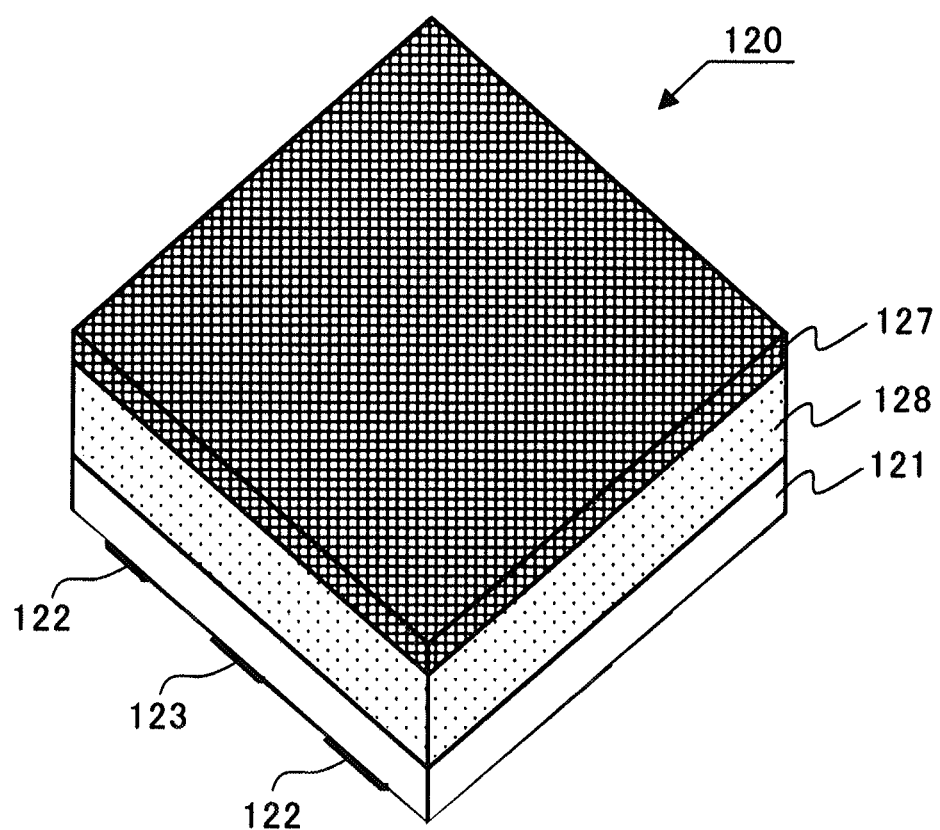

LED DEVICE

CROSS REFERENCE TO RELATED APPLICATIONS

This is the U.S. National Phase application of PCT/JP2014/066540, filed Jun. 23, 2014, which claims priority to Japanese Patent Application No. 2013-136338, filed Jun. 28, 2013 and Japanese Patent Application No. 2013-173114, filed Aug. 23, 2013, the disclosures of each of these applications being incorporated herein by reference in their entireties for all purposes.

TECHNICAL FIELD

The present invention relates to an LED device.

BACKGROUND

An LED device is known, in which an LED in a bare chip state (hereinafter, also referred to as an LED die) is mounted onto a submount substrate and which is packaged by coating with a resin or the like. The submount substrate is a small-sized substrate that is inserted between the LED die and a large-sized substrate (hereinafter, also referred to as a mother substrate) on which other electronic parts, such as resistors capacitors, are mounted, and the submount substrate is also referred to as an interposer. The submount substrate includes an anode electrode and a cathode electrode on the bottom in opposition to the surface of the mother substrate (e.g., see Patent Document 1).

FIG. 14 is a perspective view of a conventional semiconductor package corresponding to FIG. 1 of Patent Document 1, and FIG. 15 is a bottom view of a conventional semiconductor package corresponding to FIG. 4 of Patent Document 1.

An LED device (semiconductor package) 20 has a submount substrate (wire substrate) 10 and an LED die (LED element) 61 flip-chip-mounted on the submount substrate. Bumps 61a and 61b joined to the cathode electrode and the anode electrode, respectively, of the LED die are provided on the bottom of the LED die 61. The submount substrate 10 has a ceramic substrate 11 and a pair of electrodes 12 and 13 arranged on the ceramic substrate 11. Each of the pair of electrodes 12 and 13 has surface electrodes 12a and 13a, side electrodes 12b and 13b (not illustrated), and bottom electrodes 12c and 13c and those electrodes function as the anode electrode and the cathode electrode of the LED device 20. The LED die 61 is joined to land portions that are formed on the surface electrodes 12a and 13a, respectively, of the pair of electrodes 12 and 13 via the bumps 61a and 61b.

Further, pairs of recesses 11a and 11b and vias 11c and 11d are formed in the submount substrate 10. The side electrodes 12b and 13b are arranged in the pair of recesses 11a and 11b, and the vias 11c and 11d conduct heat generated in the LED die 61 from the surface of the submount substrate to the bottom.

The bottom electrodes 12c and 13c having identical shapes and the identical areas are arranged on the bottom of the LED device 20. The size and spacing of the upper-side electrodes 12a and 12b are determined by the electrode specifications (design rules, mounting accuracy, etc.) of the LED die 61, whereas the size and spacing of the bottom electrodes 12c and 13c are determined by the mounting specifications of the mother substrate.

CITATION LIST

Patent Literature

[Patent Document 1] Japanese Laid Open Patent Document No. 2005-191097 (FIGS. 1 and 4)

SUMMARY

Technical Problem

The bottom of the conventional LED device (semiconductor package) 20 illustrated in FIG. 14 may be stained, if a liquid is attached to the mother substrate on which the LED device is mounted when the LED device is mounted on the mother substrate. Foreign matter, such as a liquid, which is attached to the bottom of the LED device may cause migration and a short circuit between the electrodes of the LED device.

The object of present invention is to solve the above problem, i.e., to provide an LED device whose bottom is not stained, even if foreign matter, such as a liquid, is attached.

Solution to Problem

The LED device of the present invention has an LED die, a submount substrate on the surface of which the LED die is mounted, a frame-shaped electrode arranged along the periphery of the bottom of the submount substrate, and an inside electrode surrounded by the frame-shaped electrode and connected to the electrode of the LED die.

When the LED device is mounted on the mother substrate, the frame-shaped electrode and the inside electrode are connected to the wire electrode on the mother substrate by solder. Solder used to join the frame-shaped electrode to the mother substrate exists along the periphery of the bottom of the submount substrate that forms the bottom of the LED device, and therefore the sides along which the frame-shaped electrode is arranged on the bottom of the submount substrate are sealed. Thus, in the LED device mounted on the mother substrate, foreign matter, such as a liquid, no longer invades the bottom of the LED device through the sides along which the frame-shaped electrode is arranged.

In the LED device of the present invention, the frame-shaped electrode may be arranged across the entire periphery of the bottom.

In the LED device of the present invention, the shape of the bottom is rectangular and the frame-shaped electrode may be arranged along the three sides of the bottom.

In the LED device of the present invention, the frame-shaped electrode may be connected to the electrode of the LED die.

In the LED device of the present invention, the frame-shaped electrode may be connected to the ground wire that is formed on the mother substrate on which the LED device is mounted.

The LED device of the present invention may have at least two inside electrodes.

In the LED device of the present invention, the LED dies may be a red light-emitting LED die, a green light-emitting LED die, and a blue light-emitting LED die.

Advantageous Effects of Invention

The LED device of the present invention includes a frame-shaped electrode that is arranged along the periphery of the bottom, and therefore the bottom of the LED device may be prevented from being stained by sealing the sides along which the frame-shaped electrode is arranged on the bottom of the LED device that is mounted on the mother substrate.

BRIEF DESCRIPTION OF DRAWINGS

FIG. 12A is a bottom view of the a perspective view of a eighth embodiment;

DESCRIPTION OF EMBODIMENTS

Hereinafter, with reference to FIGS. 1 to 13 of the attached drawings, preferred embodiments of the present invention are explained in detail. In the explanation of the drawings, identical symbols are used for the identical or corresponding element, and therefore duplicated explanation is omitted. Further, the scale of the members has been changed appropriately for explanation.

First Embodiment

Figure 1:
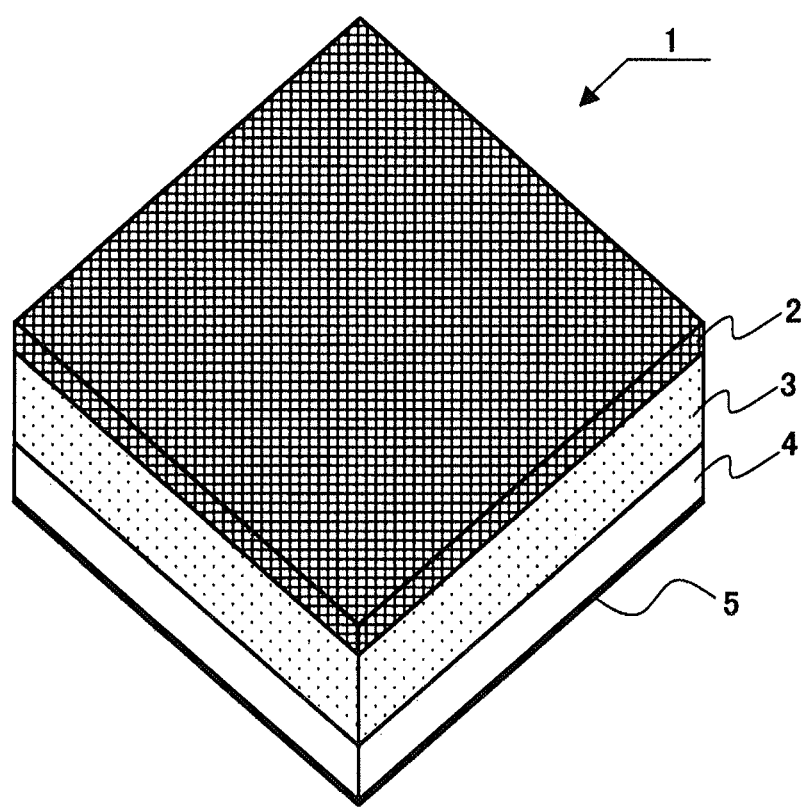
FIG. 1 is a perspective view of an LED device of a first embodiment.

FIG. 1 is a perspective view of an LED device 1 of a first embodiment. The LED device 1 has a reflection layer 2 that is arranged on the uppermost part, a phosphor layer 3 that is arranged beneath the reflection layer 2, a submount substrate 4 that is arranged beneath the phosphor layer 3, and a frame-shaped electrode 5 that is arranged beneath the submount substrate 4.

Figure 2:
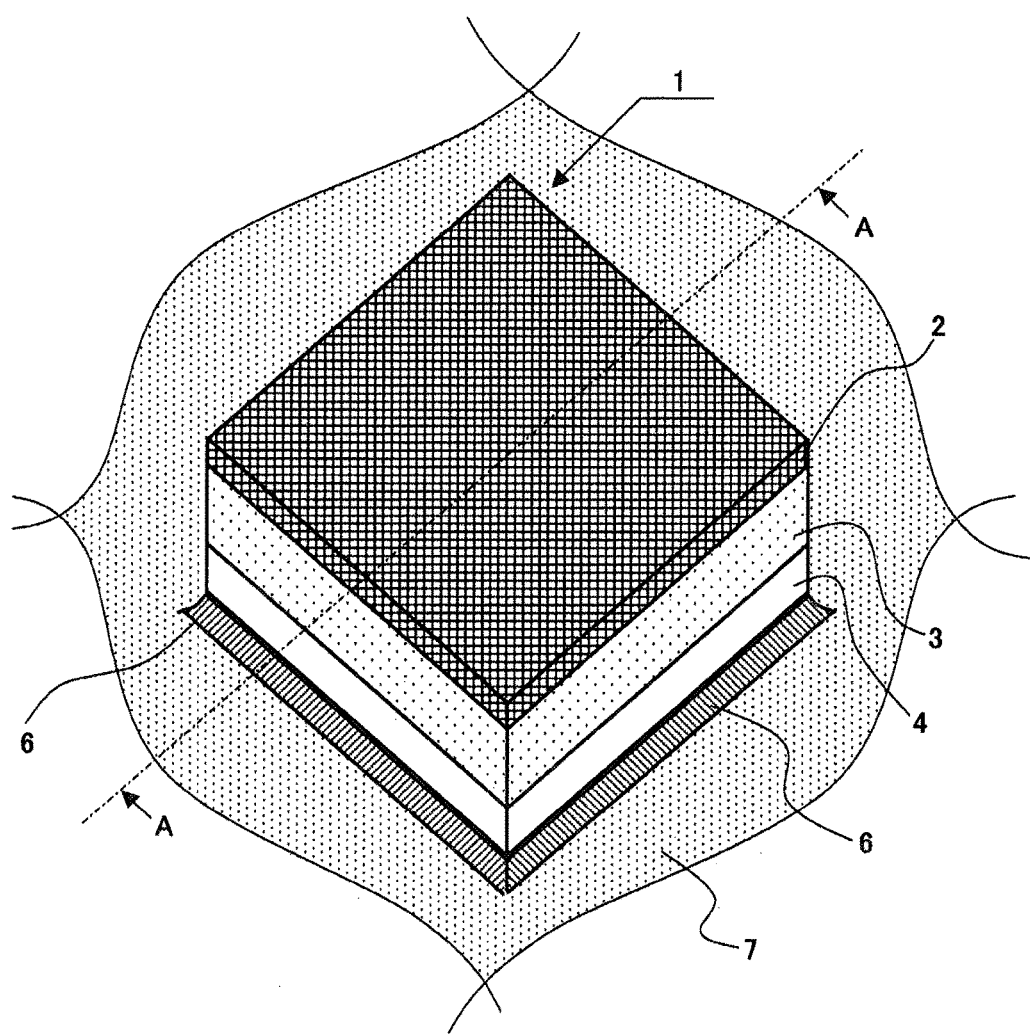
FIG. 2 is a perspective view illustrating the state where the LED device illustrated in FIG. 1 is mounted on a mother substrate.
Figure 3:
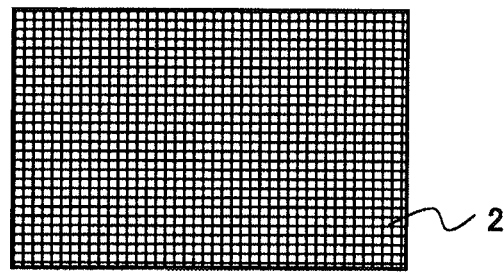
FIG. 3A is an external view of the LED device illustrated in FIG. 1.
FIG. 3B is an external view of the LED device illustrated in FIG. 1.
FIG. 3C is an external view of the LED device illustrated in FIG. 1.
Figure 3:
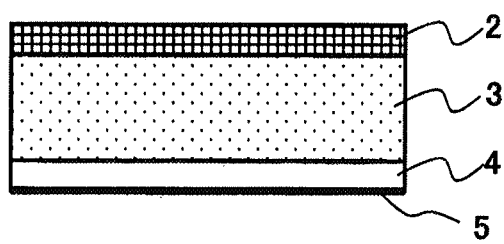
Figure 3:
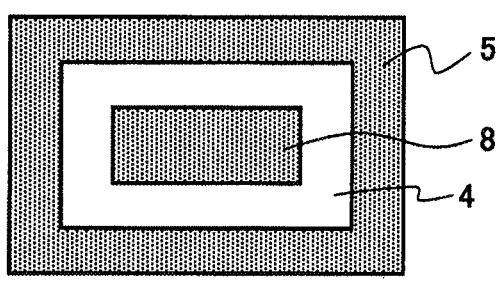

FIG. 2 is a perspective view illustrating the state where the LED device 1 of the first embodiment is mounted on a mother substrate 7. The LED device 1 is connected to a wire electrode, not illustrated, which is formed on the mother substrate 7, by solder 6. The solder 6 forms a fillet and surrounds the LED device 1.

FIGS. 3A to 3C are external views of the LED device 1 of the first embodiment and FIG. 3A is a plan view of the LED device 1, FIG. 3B is a front view of the LED device 1, and FIG. 3C is a bottom view of the LED device 1. The reflection layer 2 is seen from the surface direction of the LED device 1. The frame-shaped electrode 5, the submount substrate 4 on which the frame-shaped electrode 5 is formed, and the phosphor layer 3 and the reflection layer 2 stacked on the submount substrate 4, respectively, are seen from the front direction of the LED device 1. The frame-shaped electrode 5 that is formed and arranged so as to surround the periphery of the bottom of the submount substrate 4, and an inside electrode 8 that is surrounded by the frame-shaped electrode 5 are seen from the bottom direction of the LED device 1. The bottom of the submount substrate 4 is seen between the frame-shaped electrode 5 and the inside electrode 8.

Figure 4:
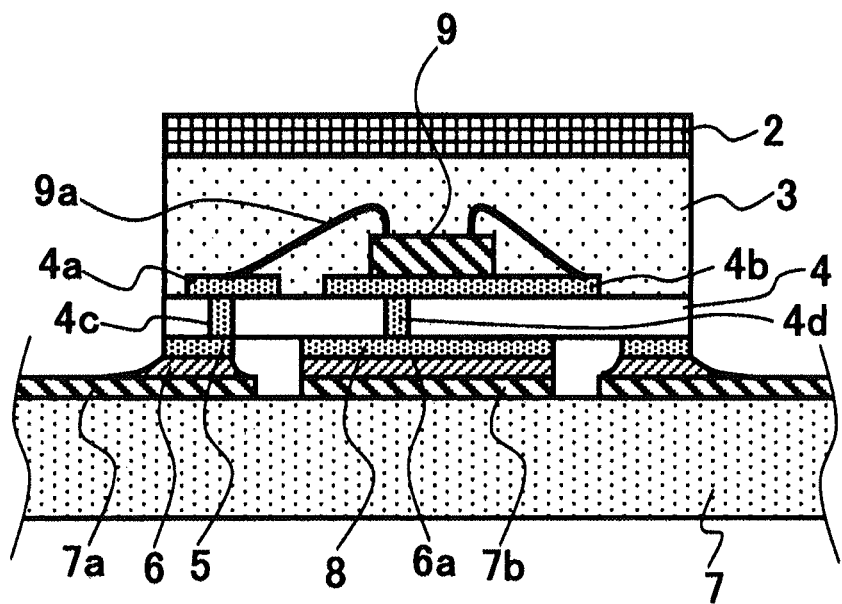
FIG. 4 is a section view of the LED device illustrated in FIG. 1.

FIG. 4 is a section view along AA line in FIG. 2. Surface electrodes 4a and 4b are formed on the surface of the submount substrate 4, and through holes 4c and 4d that penetrate through from the surface to the bottom are formed in the submount substrate 4. The surface electrode 4a is connected to the frame-shaped electrode 5 via the through hole 4c, and the surface electrode 4b is connected to the inside electrode 8 via the through hole 4d. An LED die 9 is die-bonded to the surface of the surface electrode 4b. A wire 9a connects the electrode of the LED die 9 and the surface electrodes 4a and 4b. The LED die 9 and the wire 9a are coated by the phosphor layer 3. The reflection layer 2 is arranged on the phosphor layer 3. Wire electrodes 7a and 7b are formed on the surface of the mother substrate 7. The wire electrode 7a is connected to the frame-shaped electrode 5 via the solder 6 and the wire electrode 7b is connected to the inside electrode 8 via the solder 6.

The material that forms the submount substrate 4 is selected from among insulting materials whose thermal conductivity is high. In the present embodiment, alumina whose thermal conductivity is excellent and whose reflectance is high is used as the material that forms the submount substrate 4. When the reflection layer is arranged on the surface of the submount substrate 4, aluminum nitride whose reflectance is low and whose thermal conductivity is high may be used as the material that forms the submount substrate 4. Further, a resin or a metal substrate whose surface has been subjected to insulation processing may be used as the material of the submount substrate 4.

Each of the surface electrodes 4a and 4b, the frame-shaped electrode 5, and the inside electrode 8 is formed by stacking Ni and Au on Cu. The hollow part of the through holes 4c and 4d is filled with an electrically conductive member, such as cupper paste. The LED die 9 is a blue light-emitting diode and includes a sapphire substrate and a semiconductor layer that is stacked on the sapphire. The thickness of the sapphire substrate is about 150 μm and the thickness of the semiconductor layer is slightly less than 10 μm. The semiconductor layer includes an n-type GaN layer and a p-type GaN layer that is stacked on the n-type GaN layer, and the boundary part between the n-type GaN layer and the p-type GaN layer functions as a light-emitting layer. Further, the n-type GaN layer is connected to the cathode of the LED die 9 and the p-type GaN layer is connected to the anode of the LED die 9.

The phosphor layer 3 is formed by curing silicone kneaded with phosphor. The reflection layer 2 is formed by curing silicone kneaded with alumina or titanium oxide. The reflection layer 2 may be a metal plate or a reflecting tape. Light emitted from the LED die 9 is reflected from the surface of the submount substrate 4 and from the reflection layer 2, and is emitted from the side of the LED device 1 after propagating through the phosphor layer 3. Part of the light that is emitted from the LED die 9 is wavelength-converted by the phosphor included in the phosphor layer 3.

Since the perimeter of the bottom of the LED device 1 is sealed with the solder 6, foreign matter, such as a stained liquid, is not likely to invade the bottom. Since the chances are low that the bottom of the LED device 1 is stained by foreign matter, such as a stained liquid, chances are low that a short circuit occurs between the electrodes of the LED device 1, and chances are low that migration will occur between the inside electrode 8 and the frame-shaped electrode 5. When the inventors of the invention of the application attached salt as a stained liquid to the mother substrate mounting the LED device 1, no short circuit occurred between the electrodes of the LED device 1.

Second Embodiment

Figure 5A:
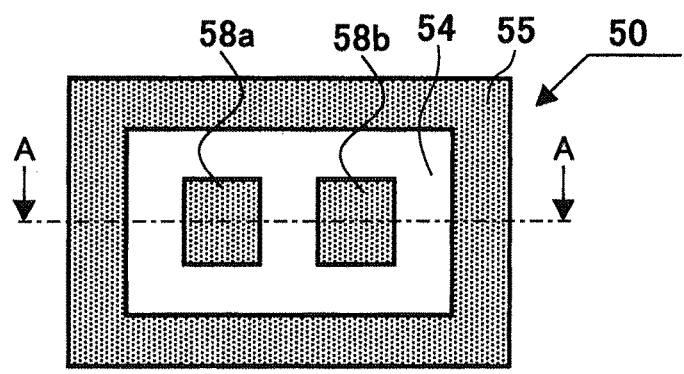
FIG. 5A is a bottom view of the LED device of a second embodiment.
Figure 5B:
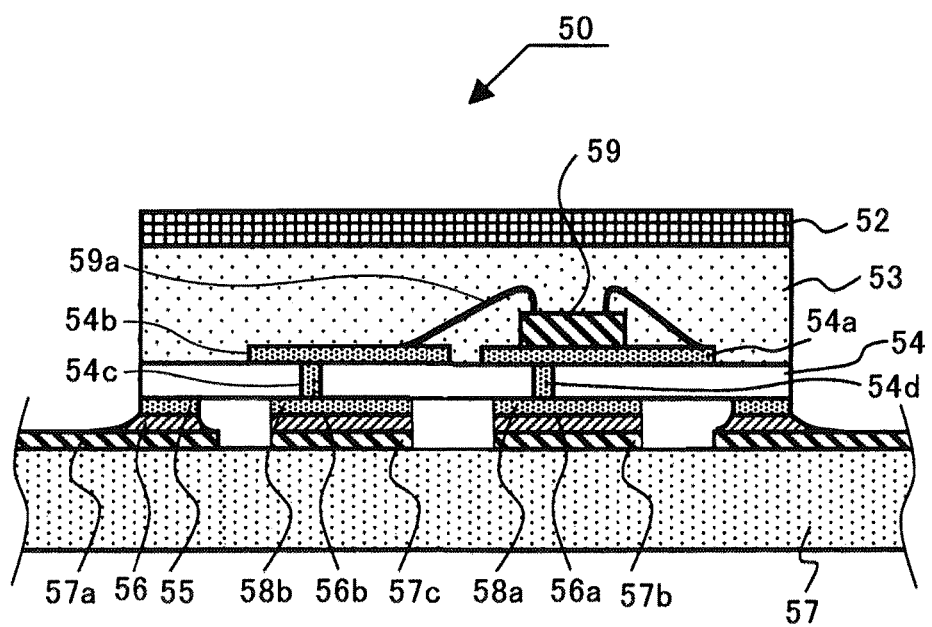
FIG. 5B is a view illustrating a mounted state of the LED device illustrated in FIG. 5A.

In the LED device 1 of the first embodiment illustrated in FIGS. 1 to 4, the frame-shaped electrode 5 is connected to one of the electrodes of the anode and the cathode of the LED die 9, and the inside electrode 8 is connected to the other electrode of the anode and the cathode. However, in an LED device of some kind of embodiments, although electrodes arranged on the bottom are connected to the anode and the cathode, its frame-shaped electrode may be connected to neither the anode nor the cathode. With reference to FIGS. 5A and 5B, an LED device 50 of a second embodiment, in which the frame-shaped electrode is connected to neither the anode nor the cathode, is explained as the second embodiment.

FIG. 5A is a bottom view of the LED device 50 of the second embodiment and FIG. 5B is a section view along AA line in FIG. 5A. An LED die 59, a phosphor layer 53, and a reflection layer 52 are arranged on a submount substrate 54 in the LED device 50, as in the LED device 1 of the first embodiment. However, since the LED device 50 has the identical external view as that of the LED device 1, a perspective view illustrating the external view of the LED device 50 is not provided (regarding embodiments to be explained below, a perspective view illustrating the external view is not provided).

A frame-shaped electrode 55 is arranged on the periphery of the bottom of the LED device 50, and two inside electrodes 58a and 58b are arranged inside the frame-shaped electrode 55. The frame-shaped electrode 55 is connected to a ground wire 57a of a mother substrate 57, and the frame-shaped electrode 55 is not connected to the LED die 59 that is mounted on the submount substrate 54. The inside electrode 58a is connected to the anode of the LED device 59 via a through hole 54d, a surface electrode 54a, and a wire. The inside electrode 58b is connected to the cathode of the LED die 59 via a through hole 54c, a surface electrode 54b, and a wire 59a.

When the LED device 50 is mounted on the mother substrate 57, since the voltage level of the frame-shaped electrode 55 that is formed on the periphery of the bottom is the ground level, and the frame-shaped electrode 55 is not connected to the LED die 59, static electricity may not affect the LED device 50.

Third Embodiment

Figure 6A:
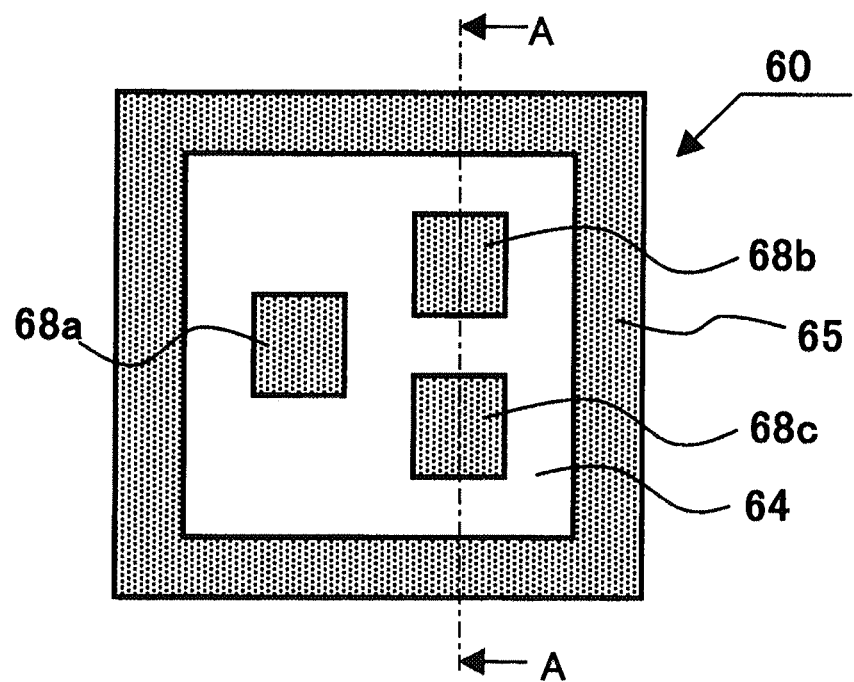
FIG. 6A is a bottom view of the LED device of a third embodiment.
Figure 6B:
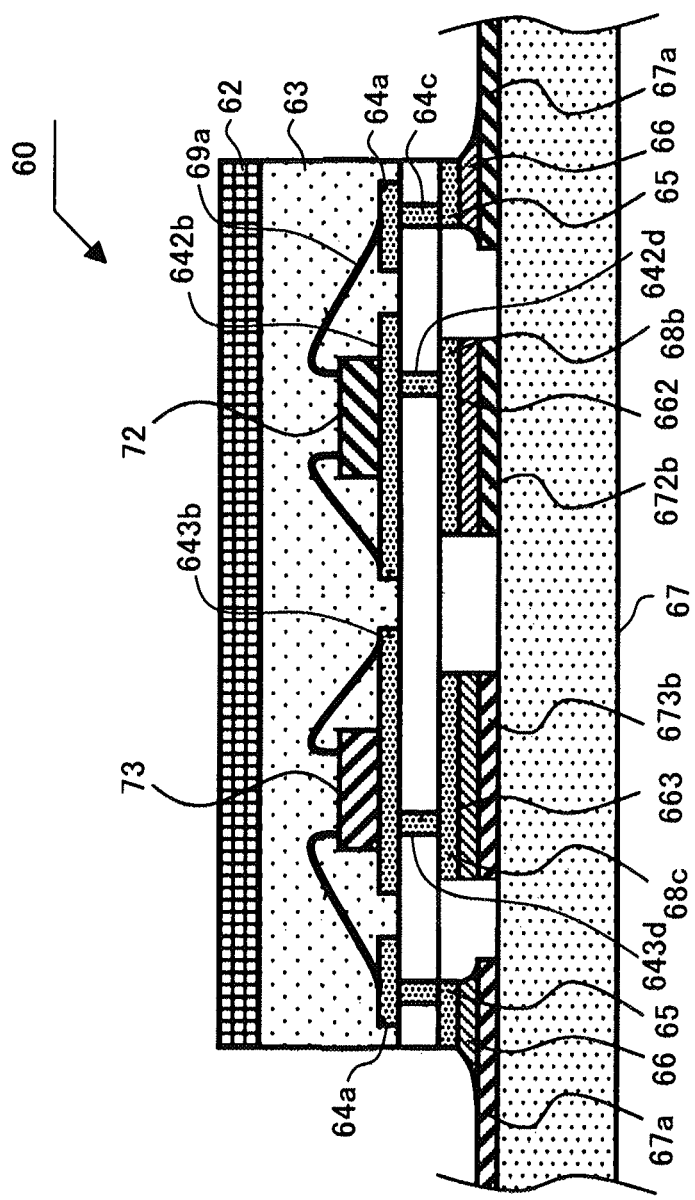
FIG. 6B is a view illustrating a mounted state of the LED device illustrated in FIG. 6A.
Figure 7:
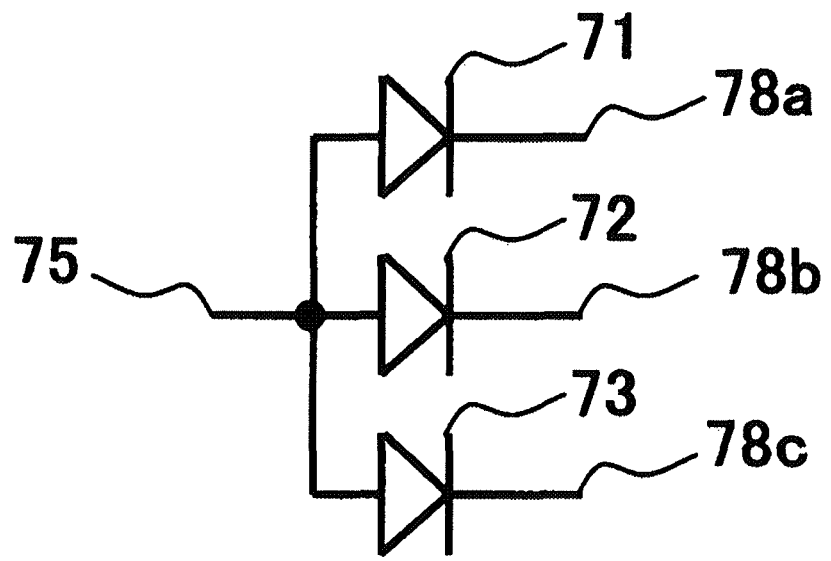
FIG. 7 is a circuit diagram of the LED device illustrated in FIG. 6A.

In the LED devices 1 and 50 of the first and second embodiments, one LED die (the LED die 9 in the LED device 1 (see FIG. 4)) is mounted on the submount substrates 4 and 54. However, the number of LED dies that are mounted on the submount substrate is not limited to one. With reference to FIGS. 6A and 6B and FIG. 7, an LED device 60 in which three LED dies are mounted on a submount substrate 64 is explained as a third embodiment.

FIG. 6A is a bottom view of the LED device 60, FIG. 6B is a section view along AA line in FIG. 6A, and FIG. 7 is a circuit diagram of the LED device 60. In the LED device 60, LED dies 71, 72, and 73, a phosphor layer 63, and a reflection layer 62 are arranged on the submount substrate 64. A frame-shaped electrode 65 is arranged on the periphery of the bottom of the LED device 60, and three inside electrodes 68a, 68b, and 68c are arranged inside the frame-shaped electrode 65. The three inside electrodes 68a, 68b, and 68c are arranged so as to form an isosceles triangle in which the inside electrode 68a is located at the vertex and the inside electrodes 68b and 68c form the base. The frame-shaped electrode 65 is a common electrode that is connected to the anode of each of the LED dies 71, 72, and 73 and the inside electrodes 68a, 68b, and 68c are connected to cathodes 78a, 78b, and 78c of the LED dies 71, 72, and 73, respectively.

The LED dies 71, 72, and 73 are a red light-emitting diode, a green light-emitting diode, and a blue light-emitting diode, respectively. The LED dies 71, 72, and 73 share an anode 75, and include the cathodes 78a, 78b, and 78c, respectively. The anode 75 of the LED dies 71, 72, and 73 is connected to the frame-shaped electrode 65 via a wire 69a, a surface electrode 64a, and a through hole 64c. The cathodes 78a, 78b, and 78c of the LED dies 71, 72, and 73 are connected to the inside electrodes 68a, 68b, and 68c. The cathode 78b of the LED die 72 is connected to the inside electrode 68b via a wire, a surface electrode 642b, and a through hole 642d. The cathode 78c of the LED die 73 is connected to the inside electrode 68c via a wire, a surface electrode 643b, and a through hole 643d. In the LED device 60, since the currents that flow through the LED dies 71, 72, and 73, respectively may be individually controlled, light may be emitted in a variety of colors by changing the currents that flow through the LED dies 71, 72, and 73.

Fourth Embodiment

Figure 8A:
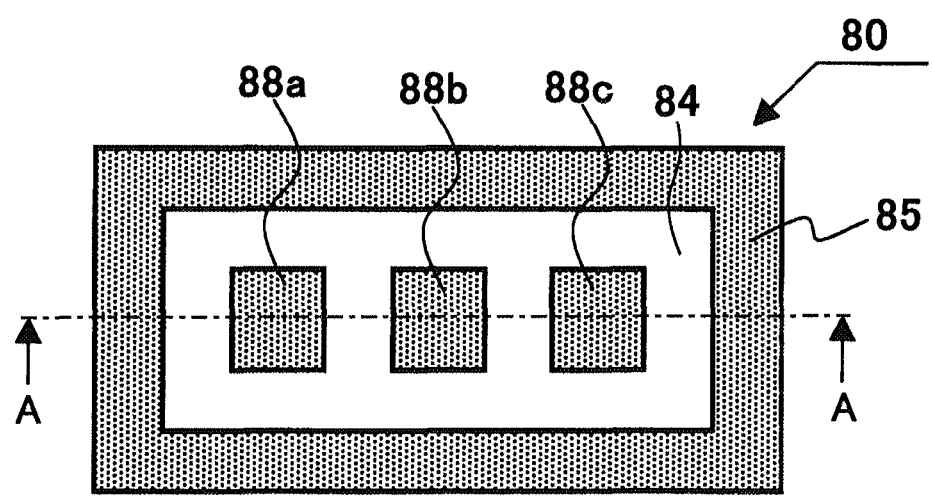
FIG. 8A is a bottom view of the LED device of a forth embodiment.
Figure 8B:
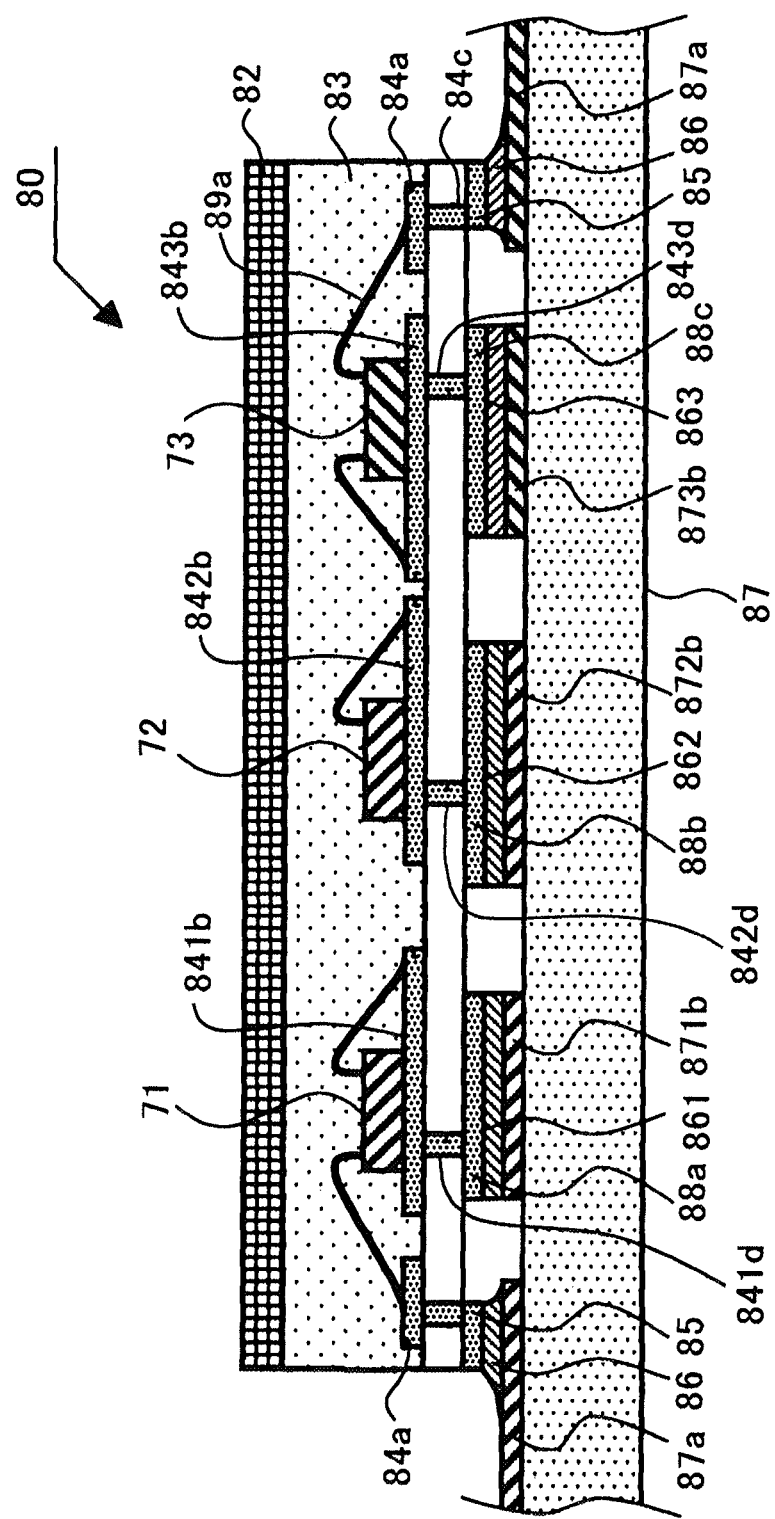
FIG. 8B is a section view illustrating a mounted state of the LED device illustrated in FIG. 8A.

In the LED device 60 of the third embodiment, the inside electrodes 68a, 68b, and 68c are arranged so as to form a triangle. However, the arrangement of the inside electrodes is not limited to the triangular arrangement in which the electrodes are arranged so as to form a triangle. With reference to FIGS. 8A and 8B, an LED device 80 in which inside electrodes are linearly arranged is explained as a fourth embodiment. FIG. 8A is a bottom view of the LED device 80. The LED device 80 has the circuit configuration illustrated in FIG. 7 like the LED device 60 of the third embodiment. In the LED device 80, the three LED dies 71, 72, and 73 (see FIG. 7), a phosphor layer 83, and a reflection layer 82 are arranged on a submount substrate 84. A frame-shaped electrode 85 is arranged on the periphery of the bottom of the LED device 80, and three inside electrodes 88a, 88b, and 88c are linearly arranged inside the frame-shaped electrode 85. The frame-shaped electrode 85 is a common electrode that is connected to the anodes of the LED dies 71, 72, and 73. The anodes 75 of the LED dies 71, 72, and 73 are connected to the frame-shaped electrode 85 via a wire 89a, a surface electrode 84a, and a through hole 84c. The inside electrodes 88a, 08b, and 88c are connected to the cathodes 78a, 78b, and 78c of the LED dies 71, 72, and 73, respectively. The cathode 78a of the LED die 71 is connected to the inside electrode 88a via a wire, a surface electrode 841b, and a through hole 841d. The cathode 78b of the LED die 72 is connected to the inside electrode 88b via a wire, a surface electrode 842b, and a through hole 842d. The cathode 78c of the LED die 73 is connected to the inside electrode 88c via a wire, a surface electrode 843b, and a through hole 843d.

Fifth, Sixth, and Seventh Embodiments

Figure 9:
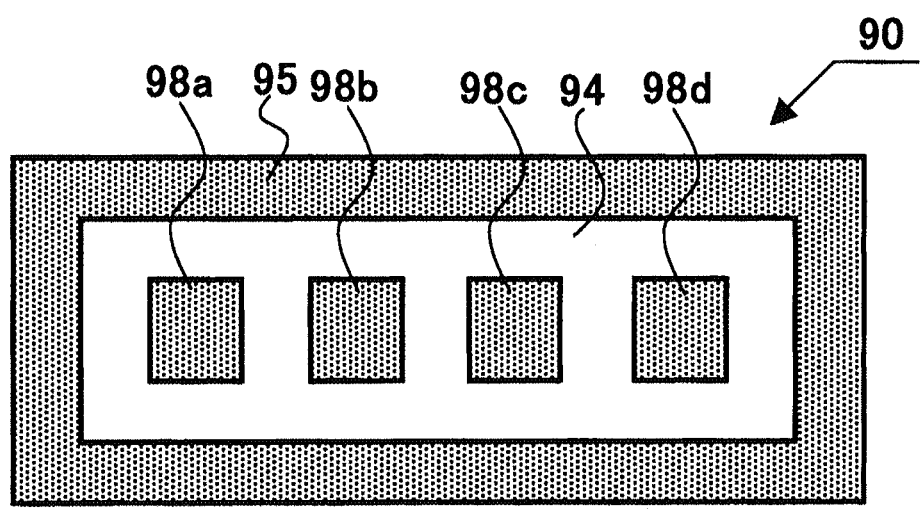
FIG. 9 is a bottom view of the LED device of a fifth embodiment.
Figure 10:
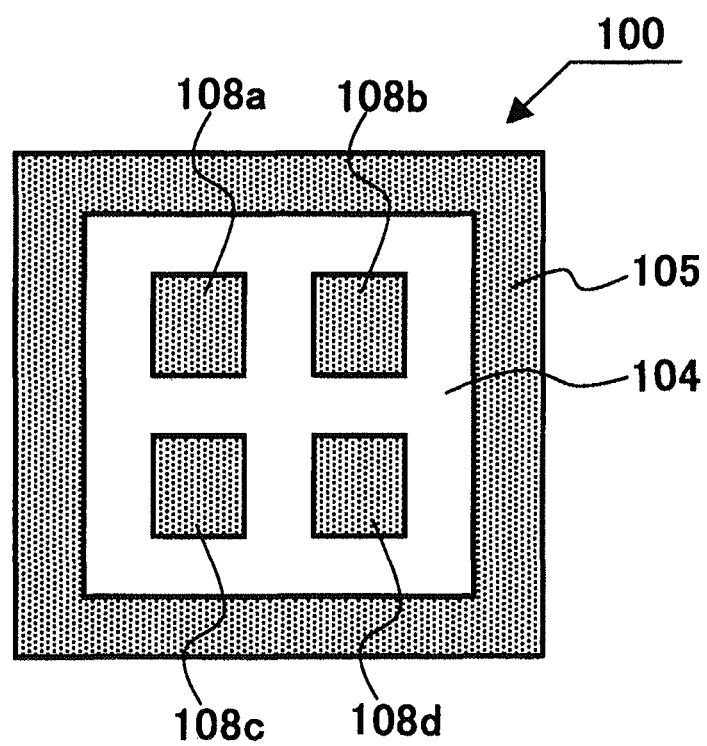
FIG. 10 is a bottom view of a sixth embodiment.
Figure 11:
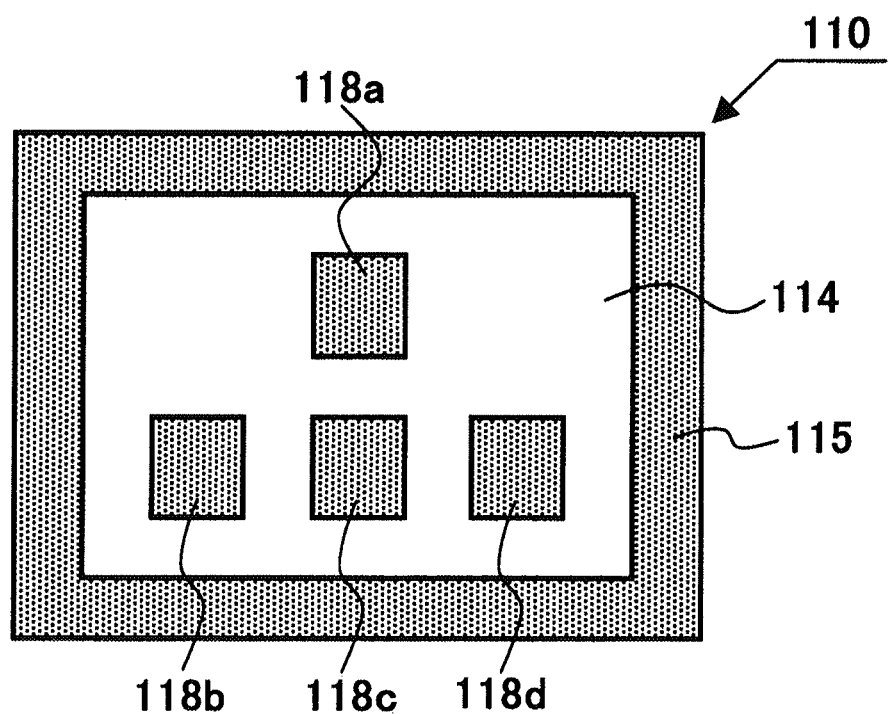
FIG. 11 is a bottom view of the LED device of a seventh embodiment.

In the LED devices 60 and 80 of the third and fourth embodiments, the frame-shaped electrodes 65 and 85 are connected to the anodes of the LED dies 71, 72, and 73. However, in the LED device of the embodiment, the frame-shaped electrode may not be connected to the anodes of the LED die 71, 72, and 73. With reference to FIGS. 9, 10, and 11, LED devices 90, 100, and 110, in which the frame-shaped electrode is connected to the ground wire of the mother substrate and is not connected to the electrode of the LED die, are explained as fifth, sixth, and seventh embodiments.

FIGS. 9, 10, and 11 are bottom views of the LED devices 90, 100, and 110, respectively. Each of the LED devices 90, 100, and 110 has the circuit configuration illustrated in FIG. 7 like the LED device 60 of the third embodiment. In the LED devices 90, 100, and 110, the three LED dies 71, 72, and 73 (see FIG. 7), a phosphor layer, and a reflection layer are arranged on submount substrates 94, 104, and 114, respectively.

A frame-shaped electrode 95 is arranged on the periphery of the bottom of the LED device 90, and inside electrodes 98a, 98b, 98c, and 98d are arranged inside the frame-shaped electrode 95. The frame-shaped electrode 95 is connected to the ground wire of the mother substrate, and the frame-shaped electrode 95 is not connected to the electrodes of the LED dies 71, 72, 73. One of the inside electrodes 98a, 98b, 98c, and 98d is connected to the common anode 75 (see FIG. 7) and the other inside electrodes are connected to the cathodes 78a, 78b, and 78c of the LEDs 71, 72, and 73, respectively.

A frame-shaped electrode 105 is arranged on the periphery of the bottom of the LED device 100, and four inside electrodes 108a, 108b, 108c, and 108d are arranged inside the frame-shaped electrode 105 so that each is located at the vertex of a square. The frame-shaped electrode 105 is connected to the ground wire of the mother substrate, and the frame-shaped electrode 105 is not connected to the electrodes of the LED dies 71, 72, and 73. One of the inside electrodes 108a, 108b, 108c, and 108d is connected to the common anode 75 (see FIG. 7) and the other inside electrodes are connected to the cathodes 78a, 78b, and 78c of the LED dies 71, 72, and 73, respectively.

A frame-shaped electrode 115 is arranged on the periphery of the bottom of the LED device 110, and an inside electrode 118a is arranged inside the frame-shaped electrode 115, and three inside electrodes 118b, 118c, and 118d are linearly arranged adjacent to the inside electrode 118a. The frame-shaped electrode 115 is connected to the ground wire of the mother substrate, and the frame-shaped electrode 115 is not connected to the electrodes of the LED dies 71, 72, and 73. The inside electrode 118a is connected to the common anode 75 (see FIG. 7) and the inside electrodes 118b, 118c, and 118d are connected to the cathodes 78a, 78b, and 78c of the LED dies 71, 72, and 73, respectively.

Eighth Embodiment

Figure 12B:
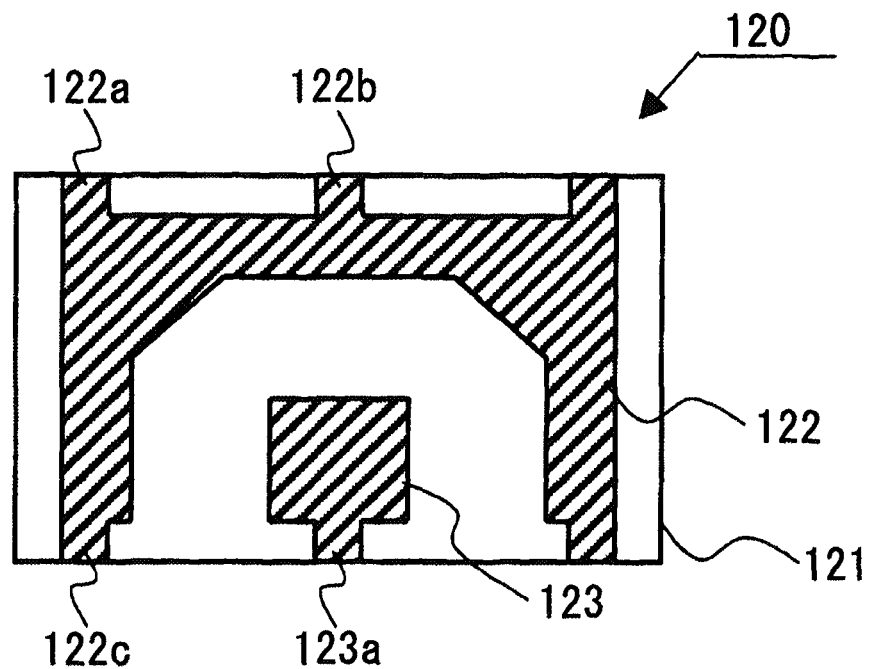
FIG. 12B is a bottom view of the LED device illustrated in FIG. 12A.
Figure 13:
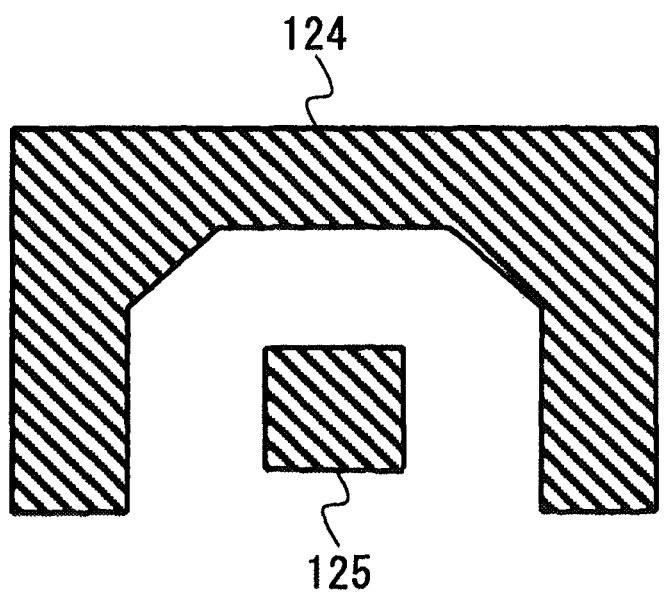
FIG. 13 is a plan view illustrating a solder pattern that is formed on the mother substrate on which the LED device illustrated in FIG. 12A is mounted.

In the LED devices 1, 50, 60, 80, 90, 100, and 110 of the first to seventh embodiments, the frame-shaped electrode is formed across the entire periphery of the bottom of the LED device. When the LED device is mounted on the mother substrate, the perimeter of the bottom of the LED device may be sealed by solder along the periphery, by forming the frame-shaped electrode across the entire periphery of the bottom of the LED device. Since the perimeter of the bottom of the LED device is sealed by solder along the periphery, electrically conductive foreign matter, such as moisture, may be prevented from invading the bottom of the LED device without performing special coating processing. However, when the frame-shaped electrode is arranged across the entire periphery of the bottom of the LED device, the inside electrode that is arranged inside the frame-shaped electrode is connected to the wire outside the frame-shaped electrode via the through hole that penetrates through the mother substrate in order to cross the frame-shaped electrode. With reference to FIGS. 12A, 12B, and 13, an LED device 120 in which inside electrodes may be connected to the wire outside the frame-shaped electrode without using the through hole is explained as an eighth embodiment.

FIG. 12A is a perspective view of the LED device 120 and FIG. 12B is a bottom view of the LED device 120. In the LED device 120, an LED die, a phosphor layer 128, and a reflection layer 127 are arranged on a submount substrate 121. Since the sectional structure of the LED device 120 is substantially the same as that of the LED device 1 of the first embodiment, the section view of the LED device 120 is not provided. A frame-shaped electrode 122 that is arranged on the bottom of the LED device 120 has three sides, i.e., an upper side, a left side that extends downward from the left end of the upper side, and a right side that extends downward from the right end of the upper side, and therefore the configuration of the frame-shaped electrode 122 is formed as the frame-shaped configuration from which one side is missing. In other words, the frame-shaped electrode 122 is formed into a U shape. The frame-shaped electrode 122 includes electroplating patterns 122a, 122b, and 122c. An inside electrode 123 is formed so as to be surrounded by the frame-shaped electrode 122. The inside electrode 123 includes an electroplating pattern 123a. When the LED device 120 is manufactured, the submount substrates 121 are connected to one another, and arranged on a large-sized substrate, and the submount substrates 121 on a large-sized substrate are individualized by cutting the large-sized substrate. When a plurality of LED devices 120 is arranged on the large-sized substrate, the electroplating pattern 122a is connected to the electroplating pattern 122c, and the electroplating pattern 122b is connected to the electroplating pattern 123a.

FIG. 13 is a plan view illustrating a solder pattern that is formed on the mother substrate on which the LED device 120 is mounted. The solder pattern that is illustrated in FIG. 13 has a solder pattern 124 that is connected to the frame-shaped electrode 122 (see FIGS. 12A and 12B) and a solder pattern 125 that is connected to the inside electrode 123. A wire on the mother substrate that is connected to the inside electrode 123 is formed so as to be connected from the opening side of the solder pattern 124 to the solder pattern 125.

Figure 14:
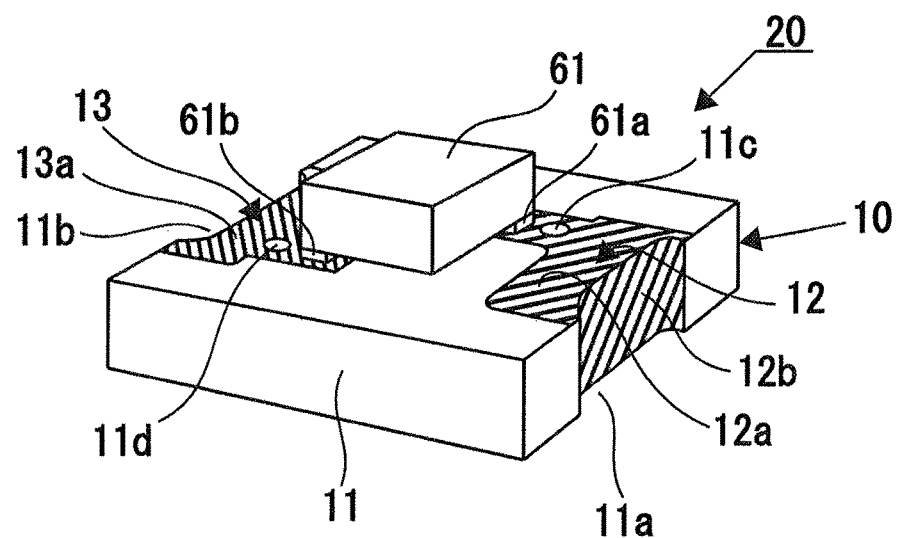
FIG. 14 is a perspective view of a conventional LED device.
Figure 15:
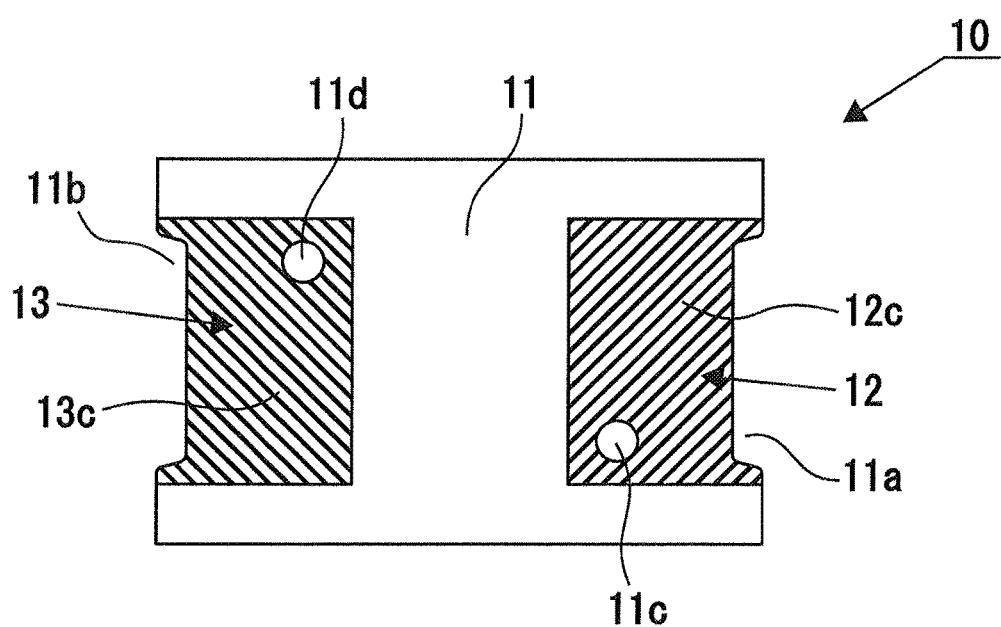
FIG. 15 is a bottom view of a conventional LED device illustrated in FIG. 14.

The LED device 120 may simplify the wire of the mother substrate on which the LED device 120 is mounted. Foreign matter is prevented from invading the bottom of the LED device 120, by performing coating processing to apply a protective member only to the side on the opening side of the solder pattern 124 (see FIG. 13) after mounting the LED device 120 on the mother substrate. The entire periphery of the bottom of the conventional LED device (see FIGS. 14 and 15) should be coated in order to prevent foreign matter from invading the bottom of the LED device, whereas only one side of the bottom of the LED device 120 is coated. When the LED device 120 is compared with the LED device 1 of the first embodiment, in which the frame-shaped electrode 5 or the like (see FIGS. 3A to 3C) is arranged across the entire periphery of the bottom of the LED device, it is not necessary to form a through hole for the wire of the inside electrode in the mother substrate by using the LED device 120. Since if the LED device 120 is used, the wire of the mother substrate is simplified, the planar size of the submount substrate 121 (see FIGS. 12A and 12B) may be reduced, and the size of the LED device 120 may be reduced.

In the LED device 120 of the eighth embodiment, although the one inside electrode 123 is arranged, a plurality of inside electrodes may be arranged in an LED device including a frame-shaped electrode in the shape of U. If a plurality of inside electrodes is arranged in an LED device including a frame-shaped electrode in the shape of U, the LED device may have a plurality of LED dies, and the colors of light emitted from the LED dies that are mounted in the LED device may be different from one another.

In the LED devices 1, 50, 60, 80, 90, 100, 110, and 120 of the first to eighth embodiments, the reflection layer 2 is arranged on the top thereof and the phosphor layer 3 is arranged on the side thereof. However, in the LED devices of the embodiments, the structure of the element that is arranged on the surface of the submount substrate on which the LED die is arranged is not limited to that of the embodiments. For example, in the LED devices of the embodiments, the LED die may be flip-chip-mounted. Further, in the LED devices of the embodiments, the reflection layer that is arranged on the top of the LED device may be removed. Furthermore, in the LED device of the embodiments, the reflection member may be arranged on the side instead of the top.

In the LED devices 1, 60, and 80 of the first, third, and fifth embodiments, the frame-shaped electrodes 5, 65, and 85 are connected to the anode of the LED die and each of the inside electrodes 8, 68a to 68c, and 88a to 88c is connected to the cathode of the LED die. In other words, in the explained embodiments, when the frame-shaped electrode is connected to the anode, the inside electrode is connected to the cathode and when the frame-shaped electrode is connected to the cathode, the inside electrode is connected to the anode. However, the frame-shaped electrode may be connected to one of the anode and the cathode, and some inside electrodes may be connected to the anode, and some others may be connected to the cathode. For example, if a LED device has electrodes on the bottom, as illustrated in FIGS. 5A and 5B, the frame-shaped electrode 55 and the inside electrode 58a may be connected to the anode of the LED die 9 (see FIG. 4), and the inside electrode 58b may be connected to the cathode of the LED die 9.

REFERENCE SIGNS LIST 1, 50, 60, 80, 90, 100, 110, 120 LED device;
2, 52, 62, 62, 127 reflection layer;
3, 53, 63, 83, 128 phosphor layer;
4, 54, 64, 84, 94, 104, 114, 121 submount substrate;
4a, 4b, 54a, 54b, 64a, 642b, 643b, 84a, 841b, 842b, 843b surface electrode;
4c, 4d, 54c, 54d, 64c, 642d, 643d, 84c, 841d, 842d, 843d through holes;
5, 55, 65, 85, 95, 105, 115, 122 frame-shaped electrode;
6, 6a, 56, 56a, 56b, 66, 662, 663, 86, 861, 862, 863 solder;
7, 57, 67, 87 mother substrate;
7a, 7b, 57a, 57b, 57c, 67a, 672b, 673b, 87a, 871b, 872b, 873b wire electrode;
8, 58a, 58b, 68a-c, 88a-c, 98a-d, 108a-d, 118a-d, 123 inside electrode;
9, 59, 71, 72, 73 LED die;
9a, 59a, 69a, 89a wire;
75 anode;
78a, 78b, 78c cathode;
122a, 122b, 122C, 123a electroplating pattern; and
124, 125 solder pattern

What is claimed is:
1. An LED device comprising:
one or more LED dies which have a first electrode and a second electrode;
a submount substrate having a top surface on which the one or more LED dies are mounted and a bottom surface;
a frame-shaped electrode that is arranged along the periphery of the bottom surface of the submount substrate, and electrically connected to the first electrode or electrically connected to neither the first electrode nor the second electrode; and
one or more inside electrodes that are surrounded by the frame-shaped electrode and which are connected to at least one of the first electrode and the second electrode, wherein
the shape of the bottom surface of the submount substrate is rectangular,
the frame-shaped electrode is arranged along only a first side of the bottom surface of the substrate, a second side of the bottom surface of the substrate in a direction perpendicular to the first side of the bottom surface of the substrate, and a third side of the bottom surface of the substrate in the direction parallel to the first side of the bottom surface of the submount substrate, and the frame-shaped electrode has a first portion arranged along the first side of the bottom surface of the substrate, a second portion arranged along the second side of the bottom surface of the substrate, a third portion arranged along the third side, and is not arranged along the fourth side of the bottom surface of the submount substrate in the direction parallel to the second side of the bottom surface of the substrate, and
both ends of the first portion and third portion of the frame-shaped electrode facing the fourth side of the bottom surface of the substrate touch the fourth side of the bottom surface of the substrate.
2. The LED device according to claim 1, wherein the frame-shaped electrode is connected to a ground wire that is formed on a mother substrate on which the LED device is mounted.

3. The LED device according to claim 1, wherein the one or more LED dies are a red light-emitting LED die, a green light-emitting LED die, and a blue light-emitting LED die.

4. The LED device according to claim 1, wherein the frame-shaped electrode is connected to the first electrode of the one or more LED dies.

* * * * *

UNITED STATES PATENT AND TRADEMARK OFFICE
CERTIFICATE OF CORRECTION

| | | |
|---|---|---|
| PATENT NO. | : 10,170,674 B2 | Page 1 of 1 |
| APPLICATION NO. | : 14/901471 | |
| DATED | : January 1, 2019 | |
| INVENTOR(S) | : Isao Miyashita et al. | |

It is certified that error appears in the above-identified patent and that said Letters Patent is hereby corrected as shown below:

On the Title Page

Item (71) Applicants: delete "CITIZEN HOLDINGS CO., LTD., Nishitokyo-shi, Tokyo (JP)" and insert --CITIZEN WATCH CO., LTD., Tokyo (JP)--

Signed and Sealed this
Twenty-sixth Day of November, 2019

Andrei Iancu
*Director of the United States Patent and Trademark Office*